United States Patent
Chang

(10) Patent No.: US 10,613,647 B2
(45) Date of Patent: Apr. 7, 2020

(54) PORTABLE ELECTRONIC DEVICE AND STYLUS THEREOF

(71) Applicant: waltop International Corporation, Hsinchu (TW)

(72) Inventor: Yi-Chih Chang, Hsinchu (TW)

(73) Assignee: WALTOP INTERNATIONAL CORPORATION, Hsinchu (TW)

( * ) Notice: Subject to any disclaimer, the term of this patent is extended or adjusted under 35 U.S.C. 154(b) by 57 days.

(21) Appl. No.: 16/009,124

(22) Filed: Jun. 14, 2018

(65) Prior Publication Data

US 2019/0272049 A1 Sep. 5, 2019

(30) Foreign Application Priority Data

Mar. 2, 2018 (TW) .............................. 107107090 A

(51) Int. Cl.
*G06F 3/0354* (2013.01)
*G06F 3/041* (2006.01)
*H05K 5/00* (2006.01)

(52) U.S. Cl.
CPC .......... *G06F 3/03545* (2013.01); *G06F 3/041* (2013.01); *H05K 5/0039* (2013.01)

(58) Field of Classification Search
CPC .... G06F 3/03545; G06F 3/041; H05K 5/0039
USPC ....................................................... 345/173
See application file for complete search history.

(56) References Cited

U.S. PATENT DOCUMENTS

| | | | |
|---|---|---|---|
| 5,565,632 A | 10/1996 | Ogawa | |
| 5,914,708 A | 6/1999 | LaGrange | |
| 2015/0205390 A1* | 7/2015 | Yeh | ........ G06F 3/0383 345/179 |
| 2017/0068340 A1* | 3/2017 | Zimmerman | ....... G06F 3/04162 |

FOREIGN PATENT DOCUMENTS

| | | |
|---|---|---|
| TW | 201541289 A | 11/2015 |
| TW | M526117 U | 7/2016 |
| TW | M526118 U | 7/2016 |
| TW | M543401 U | 6/2017 |

* cited by examiner

*Primary Examiner* — Amare Mengistu
*Assistant Examiner* — Gloryvid Figueroa-Gibson
(74) *Attorney, Agent, or Firm* — Li & Cai Intellectual Property (USA) Office

(57) ABSTRACT

A portable electronic device includes a stylus including a pen-shaped casing structure, a support structure, a rear circuit board, a function assembly, a pen head structure and a power supply. The support structure is disposed in the casing structure. The rear circuit board is positioned on the support structure. The function assembly is disposed on the support structure. The head structure is partially disposed out of the casing structure. The power supply is electrically connected to the rear circuit board. The function assembly includes first, second and third conductive members, first and second movable members, and a button body. When the button body is pressed to drive the first and second movable members to move simultaneously, the first movable member simultaneously electrically contacts the first and second conductive members, so the first and the second conductive members are electrically connected with each other through the first movable member.

10 Claims, 12 Drawing Sheets

PORTABLE ELECTRONIC DEVICE AND STYLUS THEREOF

CROSS-REFERENCE TO RELATED PATENT APPLICATION

This application claims the benefit of priority to Taiwan Patent Application No. 107107090, filed on Mar. 2, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device and a stylus thereof, and more particularly to a portable electronic device and a stylus thereof.

BACKGROUND OF THE DISCLOSURE

A conventional touch panel can be resistive, electromagnetic or capacitive. In operation, resistive touch panels require force exertion on a very small area using a pen tip. Electromagnetic touch panels require special pens equipped with batteries for inputting. Capacitive touch panels generate capacitive coupling effects when an object touches a capacitive touch panel, so as to detect a touch location of the object based on the change of capacitance value. Therefore, capacitive touch panels render concentrated force exertion and power-consuming inputting pens unnecessary, thereby achieving longer service life. Further, a capacitive touch panel has a simpler composition and fewer components, and can be produced with high product yield, leading to its lower cost in mass production.

There are many ways to operate a capacitive touch panel, the most common one being touching or sliding on its surface with a finger or a pen so that a sensor in the touch panel can generate a corresponding signal. However, as the application of the capacitive touch panel grows, their lower detection accuracy compromises operation fluency, especially when it comes to certain applications requiring exact detection. Therefore, many users choose to use capacitive styli to increase touch control accuracy. However, a tail portion of a conventional capacitive stylus does not have any other special structure or function, leaving room for improvement in the related art.

SUMMARY OF THE DISCLOSURE

In response to the above-referenced technical inadequacies, the present disclosure provides an electronic device and a stylus thereof.

In certain aspects, the present disclosure provides a stylus including a pen-shaped case structure, a support structure, a rear circuit board, a function assembly, a pen head structure and a power supply element. The support structure is disposed on the case structure. The rear circuit board is positioned on the support structure. The function assembly is disposed on the support structure. A portion of the head structure is disposed outside of the case structure. The power supply element is electrically connected to the rear circuit board. The function assembly includes a first conductive member, a second conductive member, a third conductive member, a first movable member, a second movable member and a button body. The first conductive member, the second conductive member and the third conductive member are electrically connected to the rear circuit board. The first movable member is configured to separably contact the first conductive member and the second conductive member. A portion of the third conductive member is sleeved on the second movable member, and abutted and contacted by the button body.

In certain aspects, the present disclosure provides a portable electric device including a touch panel and a stylus for touching the touch panel to control the touch panel.

One of the beneficial effects of the present disclosure is that, through the technical features of "the first movable member can separably contact the first conductive member and the second conductive member" and "a part of the third conductive member is sleeved on the second movable member, and abutted and contacted by the button body," the portable electronic device and a stylus thereof, as provided by the present disclosure, enable the second movable member to electrically and simultaneously contact the first and second conductive members when the button body is pressed to drive simultaneous movement of the first and second movable members. Thereby, the first conductive member and the second conductive member can electrically connect with each other through the first movable member.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
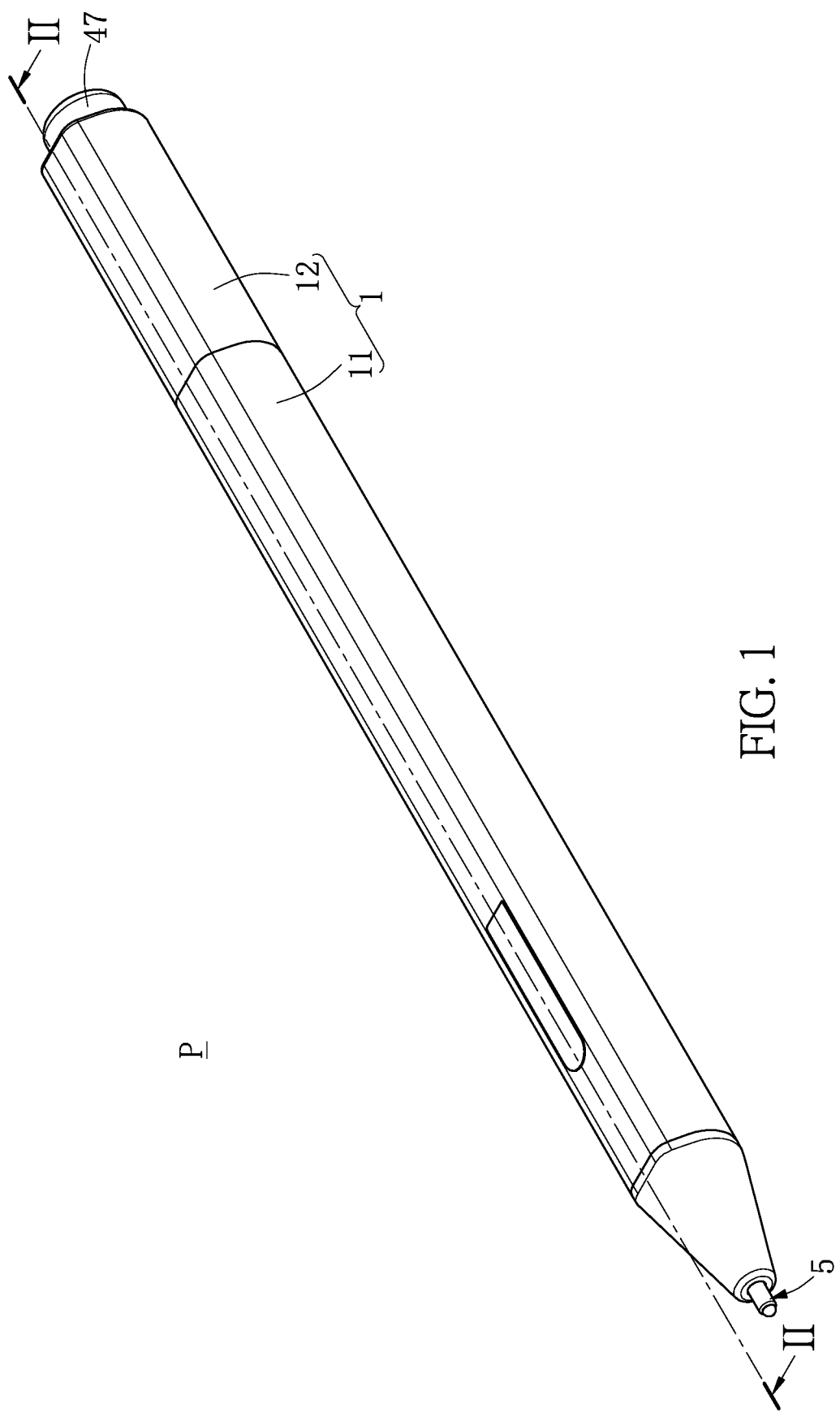
FIG. 1 is a perspective view of a stylus according to an embodiment of the present disclosure.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

While numbering terms such as "first", "second" or "third" may be used in this disclosure to describe various components, signal or the like, the terms are for distinguishing one component from another component, or one signal from another signal only, and are not intended to, nor should they be construed to impose any other substantive descriptive limitations on the components, signals or the like.

Referring to FIGS. 1-13, the present disclosure provides a stylus P including a pen-shaped case structure 1, a support structure 2, a rear circuit board 3, a function assembly 4, a pen head structure 5, and a power supply element 6. Further, the support structure 2 is disposed within the case structure 1. The rear circuit board 3 is disposed within the case structure 1 and is positioned on the support structure 2. The function assembly 4 includes a first conductive member 41 electrically connected to the rear circuit board 3, a second conductive member 42 electrically connected to the rear circuit board 3, a first movable member 45 separably contacting the first conductive member 41 and the second conductive member 42, a second movable member 46 corresponding to and operating in coordination with the first movable member 45, a third conductive member 43 electrically connected to the rear circuit board 3 and partially sleeved on the second movable member 46, and a button body 47 corresponding to and operating in coordination with the second movable member 46. A portion of the third conductive member 43 is sleeved on the second movable member 46, and is abutted and contacted by the button body 47. A portion of the head structure 5 is disposed outside of the case structure 1, and the other portion of the head structure 5 is disposed inside the case structure 1. The power supply element 6 is disposed inside the case structure 1 and electrically connected to the rear circuit board 3. In certain embodiments, the power supply element 6 can be a power supply.

Therefore, when the button body 47 is pressed to drive the first movable member 45 and the second movable member 46 to move simultaneously, the first movable member 45 can electrically contact the first conductive member 41 and the second conductive member 42 simultaneously, so that the first conductive member 41 and the second conductive member 42 can be electrically connected to each other through the first movable member 45.

Figure 2:
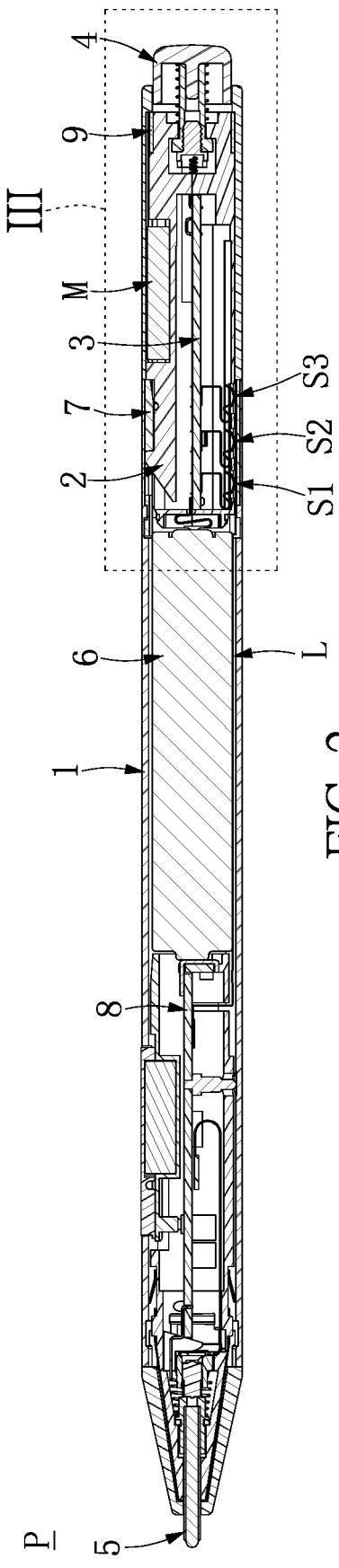
FIG. 2 is a schematic sectional view taken along line II-II of FIG. 1.
Figure 3:
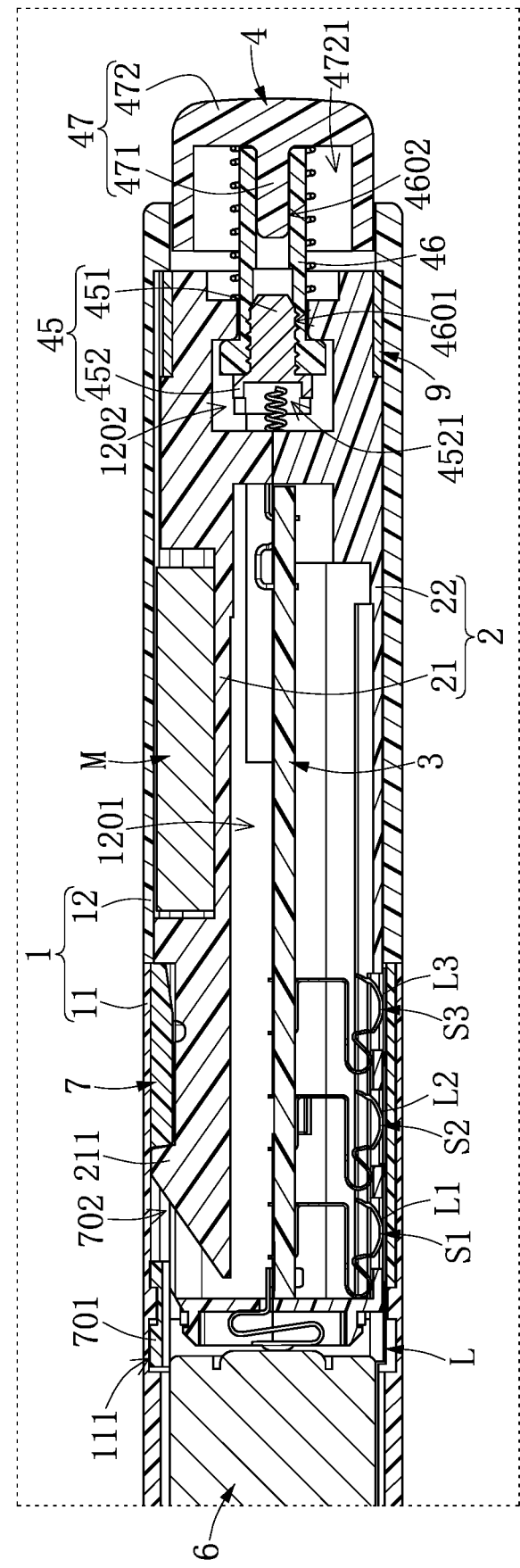
FIG. 3 is a schematic enlarged view of a portion III of FIG. 2.
Figure 4:
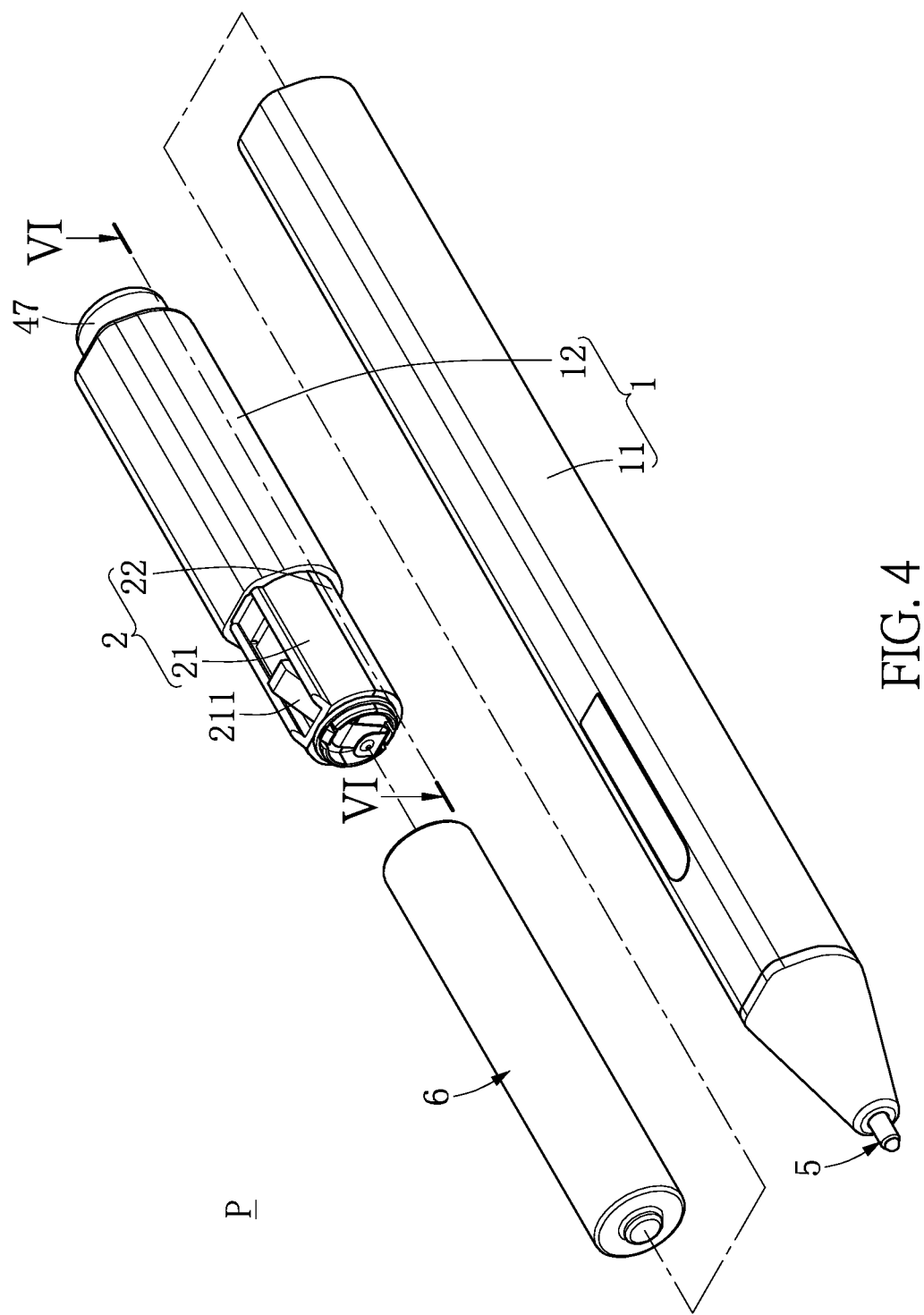
FIG. 4 is a first schematic exploded view of a stylus according to an embodiment of the present disclosure.
Figure 5:
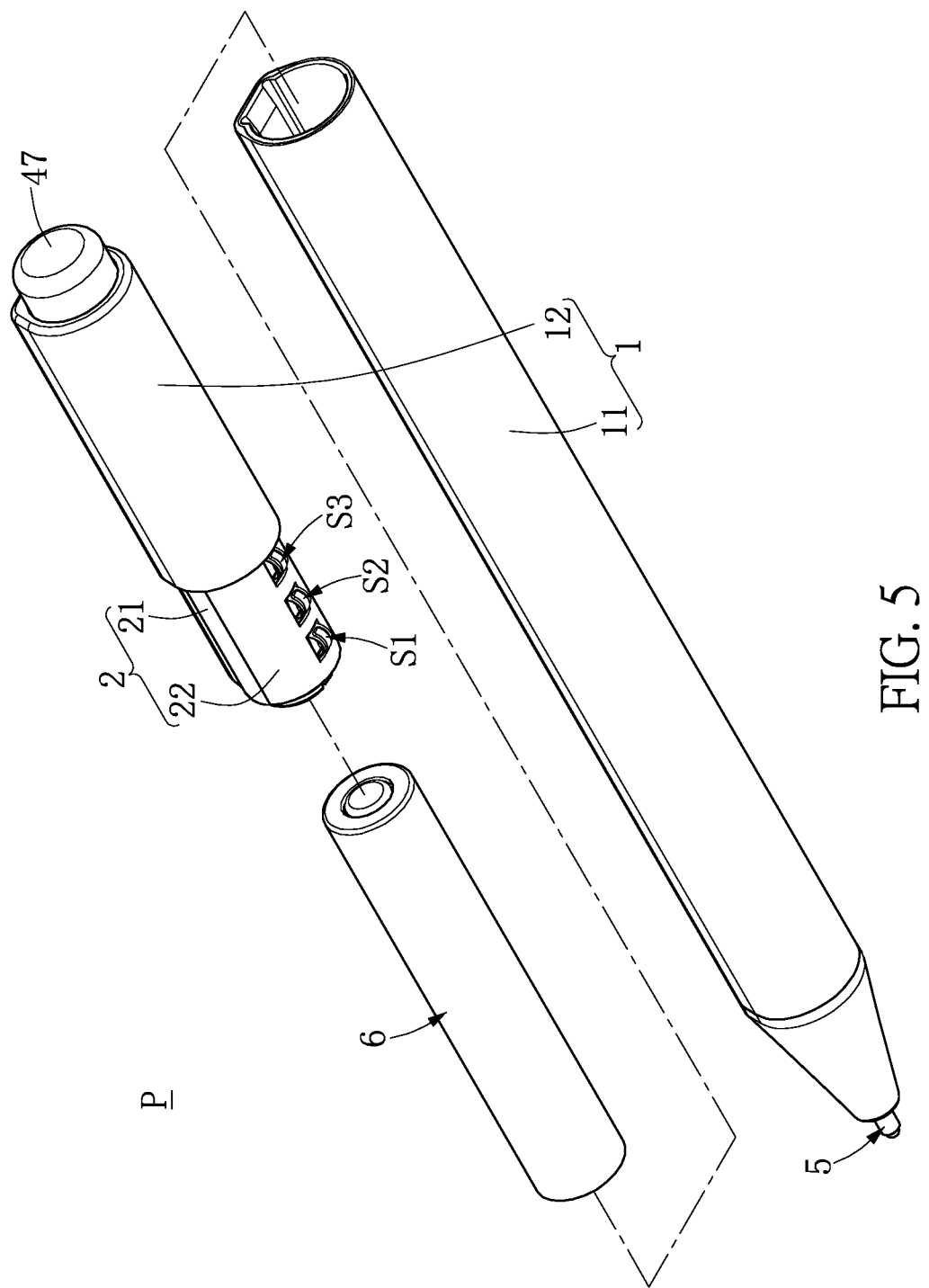
FIG. 5 is a second schematic exploded view of a stylus according to an embodiment of the present disclosure.
Figure 6:
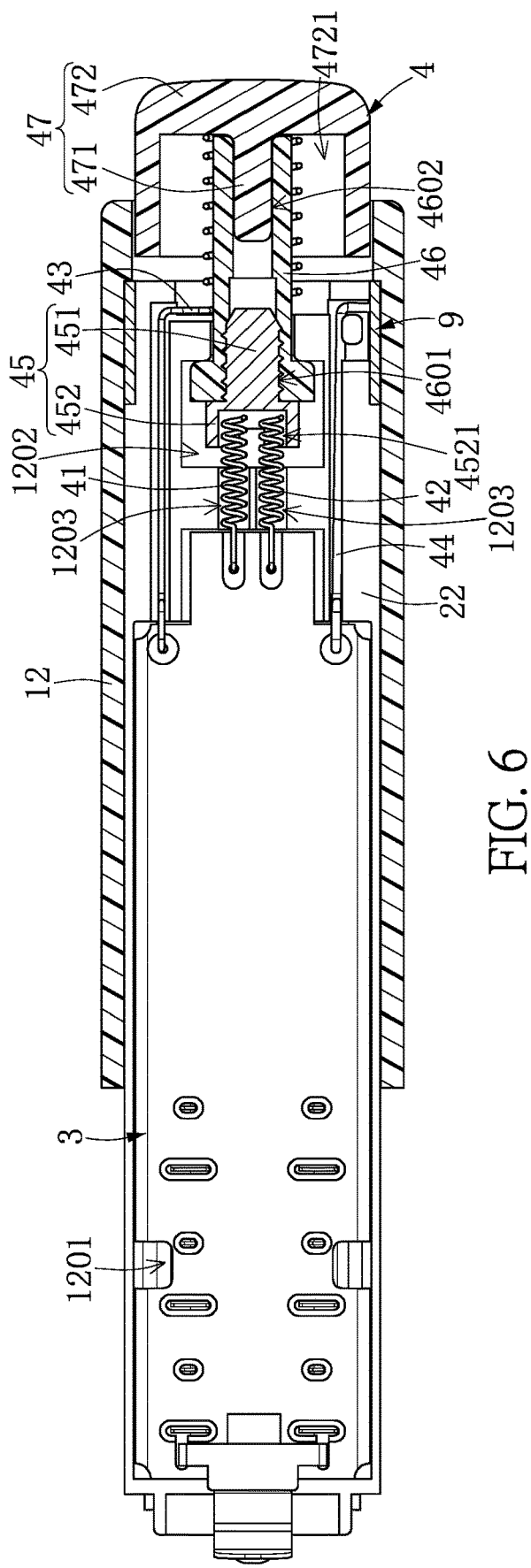
FIG. 6 is a schematic sectional view taken along line VI-VI of FIG. 4.

For example, as shown in FIG. 2, FIG. 3 and FIG. 6, the case structure 1 includes a front case 11 and a rear case 12 corresponding in structure to the front case 11. An inner fastening slot 111 is formed on the inner surface of the front case 11. In addition, the support structure 2 includes a first supporting member 21 and a second supporting member 22 corresponding in structure to the first supporting member 21. An outer fastening portion 211 is formed on the outer surface of the first supporting member 21. Further, the support structure 2 has a first accommodating space 1201 between the first supporting member 21 and the second supporting member 22, a second accommodating space 1202 between the first supporting member 21 and the second supporting member 22, and two communicating spaces 1203 communicating between the first accommodating space 1201 and the second accommodating space 1202. In addition, the rear circuit board 3 is positioned in the first accommodating space 1201, a contact portion 452 of the first movable member 45 is movably disposed in the second accommodating space 1202, the first conductive member 41 passes through one of the two communicating spaces 1203, and the second conductive member 42 passes through the other one of the two communicating spaces 1203.

Figure 7:
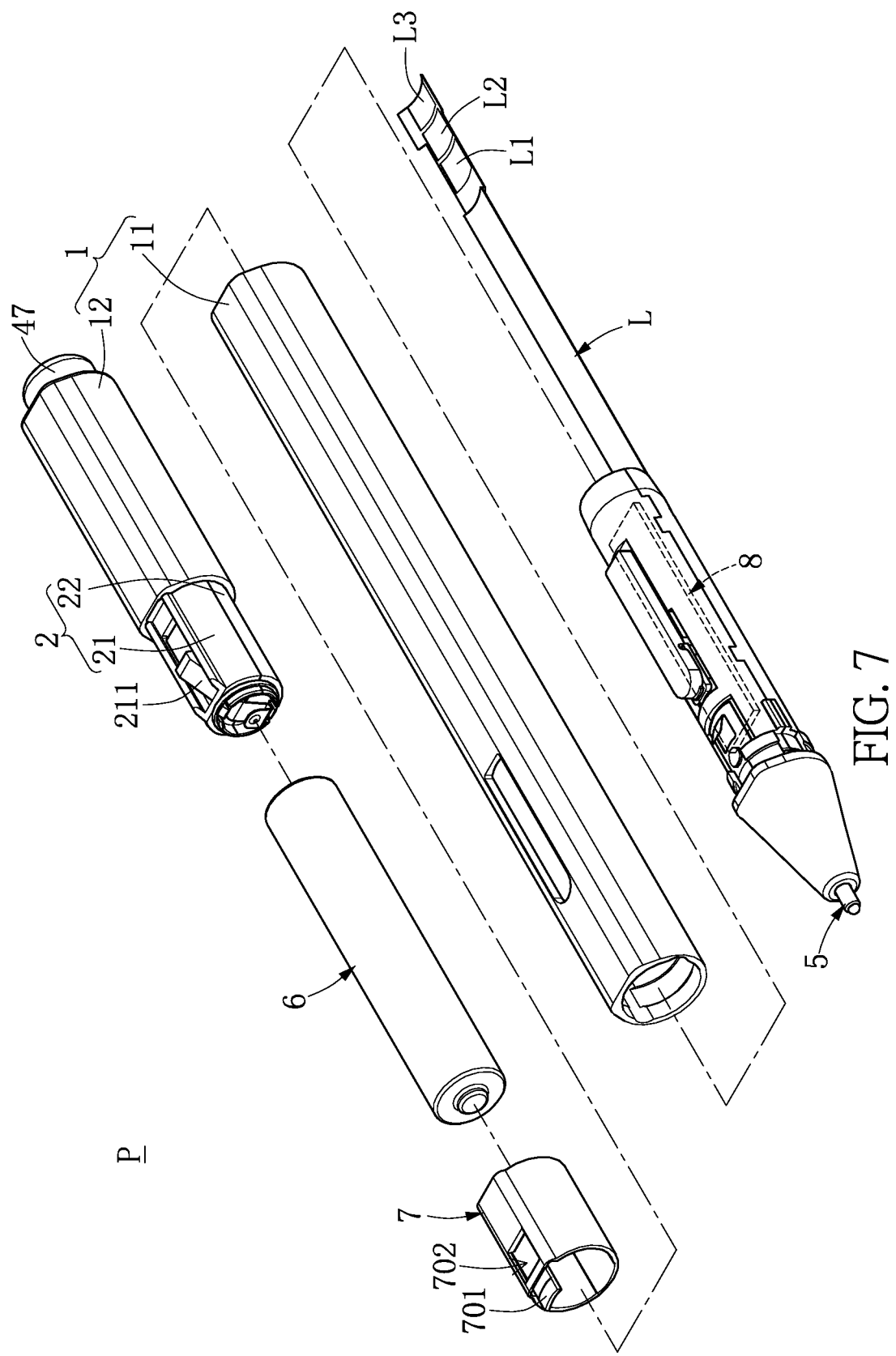
FIG. 7 is a third exploded schematic exploded view of a stylus according to an embodiment of the present disclosure.
Figure 8:
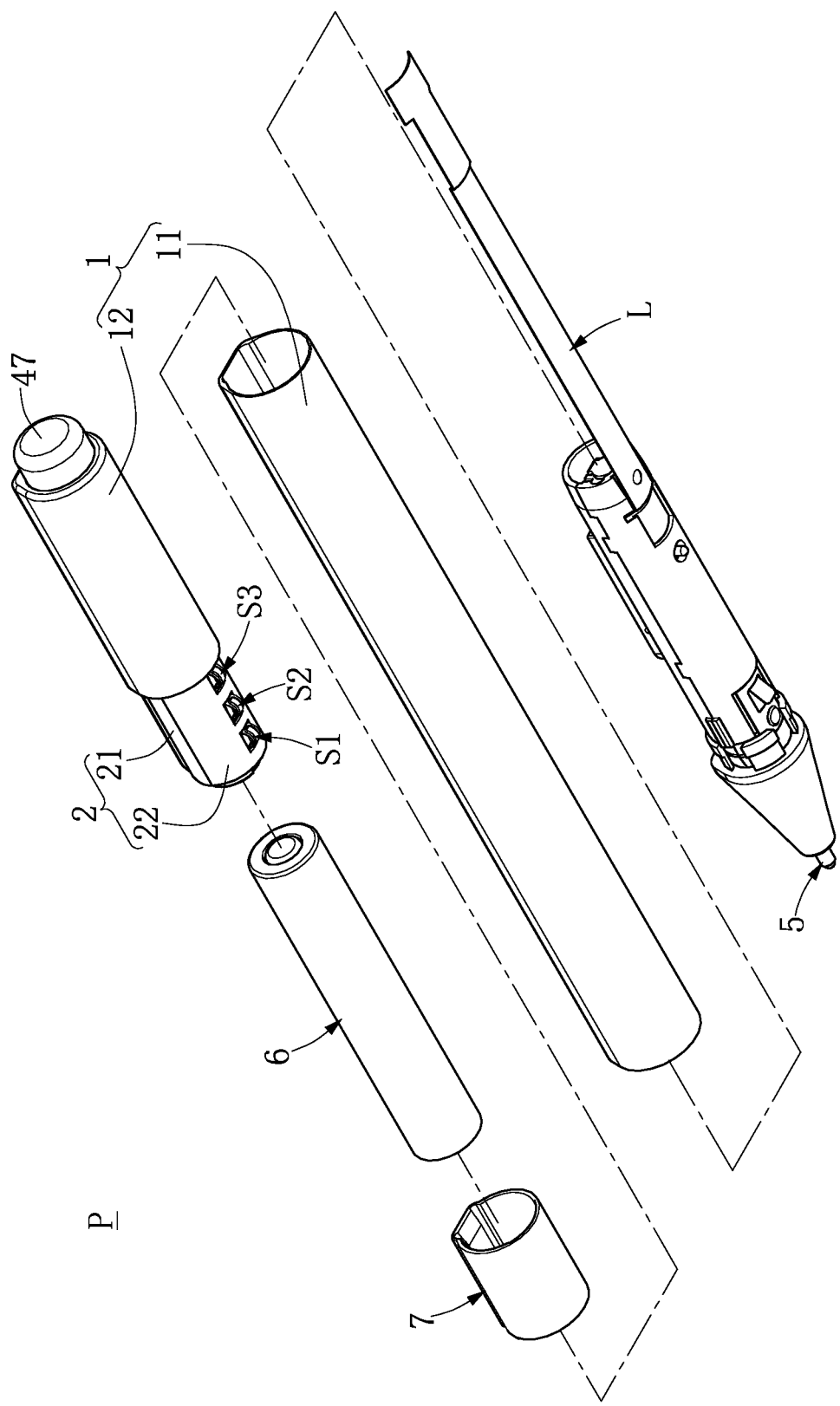
FIG. 8 is a fourth schematic exploded view of a stylus according to an embodiment of the present disclosure.
Figure 9:
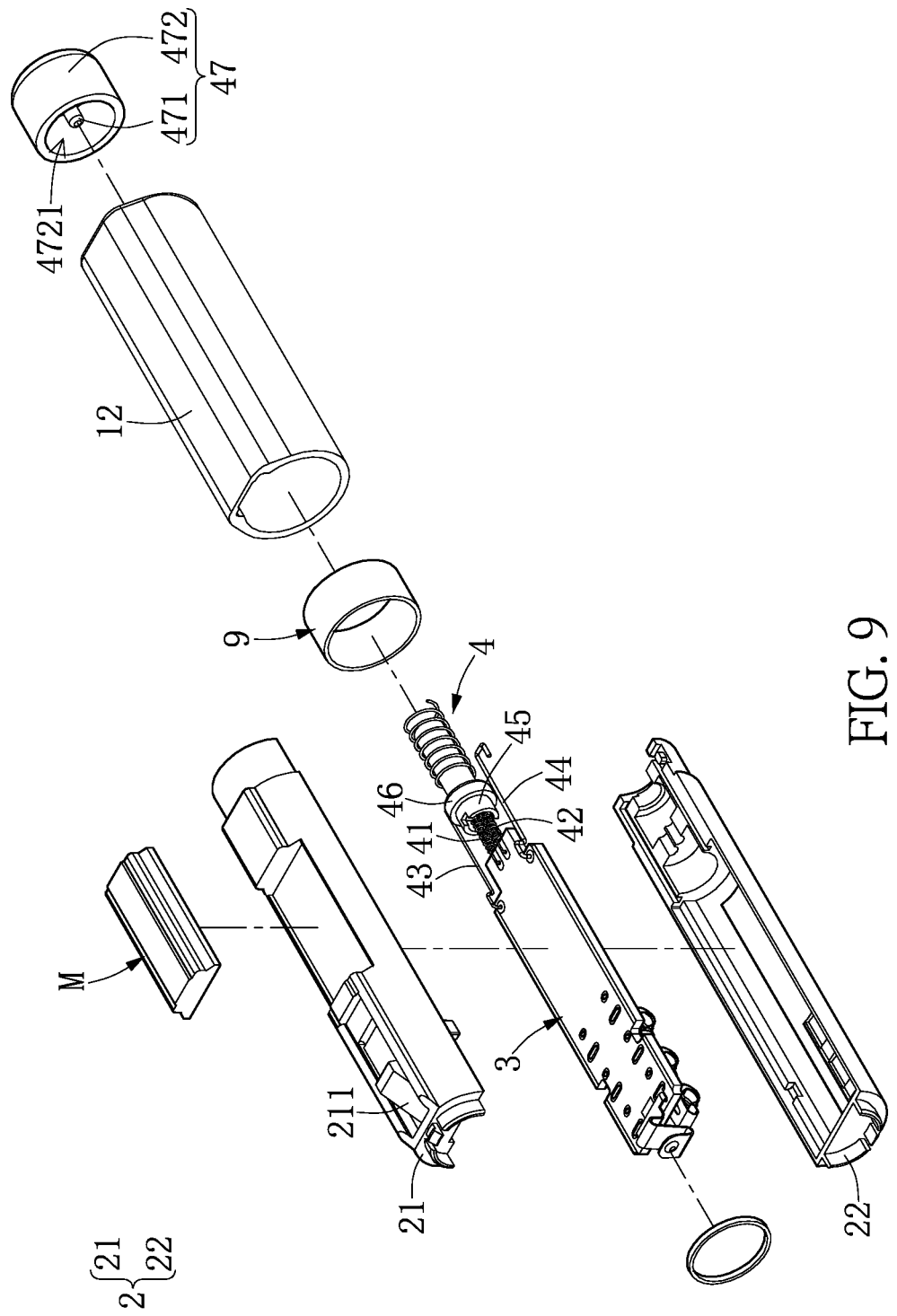
FIG. 9 is a fifth schematic exploded view of a stylus according to an embodiment of the present disclosure.
Figure 10:
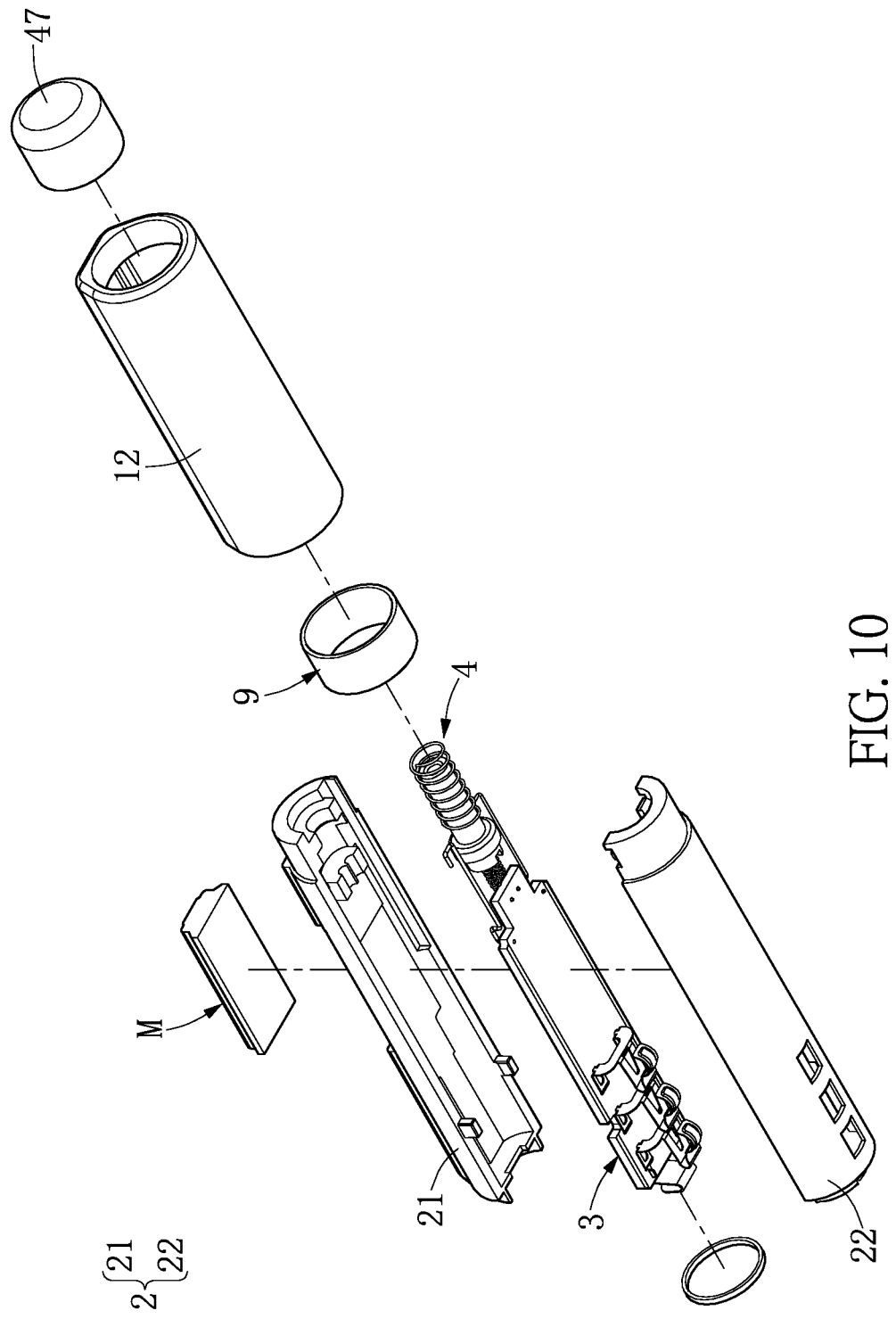
FIG. 10 is a sixth schematic exploded view of a stylus according to an embodiment of the present disclosure.

In certain embodiments, as shown in FIG. 2, FIG. 3 and FIG. 7, the stylus P provided by the present disclosure further includes a hollow fastening structure 7. The hollow fastening structure 7 is detachably disposed in the front case 11, and the hollow fastening structure 7 has a fastening portion 701 for being wedged into and mated with the inner fastening slot 111, and a fastening slot 702 for being wedged and mated with the outer fastening portion 211. In other words, when the hollow fastening structure 7 is detachably disposed in the front case 11, the fastening portion 701 of the hollow fastening structure 7 is fastened into the inner fastening slot 111 of the front case 11. When the front case 11 and the rear case 12 match with each other so that a portion of the support structure 2 is inserted into the front case 11, the outer fastening portion 211 of the first supporting member 21 is fastened in the fastening slot 702 of the hollow fastening structure 7.

In certain embodiments, as shown in FIG. 2, FIG. 3, FIG. 7 and FIG. 8, the stylus P provided by the present disclosure further includes a signal transmission line L. The signal transmission line L is electrically connected between a front circuit board 8 and the rear circuit board 3. The signal transmission line L has a negative electrode contact L1, an erasing signal contact L2 and an erasing pressure level contact L3, which, in certain embodiments, are disposed in the hollow fastening structure 7.

In certain embodiments, as shown in FIG. 2, FIG. 3 and FIG. 7, the stylus P provided by the present disclosure further includes a first elastic sheet S1 for conducting the negative electrode, a second elastic sheet S2 for conducting the erasing signal, and a third elastic sheet S3 for conducting an erasing pressure level (single/member). Further, the first elastic sheet S1 is disposed on the rear circuit board 3, and passes through the support structure 2 to electrically contact the negative electrode contact L1. The second elastic sheet S2 is disposed on the rear circuit board 3, and passes through the support structure 2 to electrically contact the erasing signal contact L2. The third elastic sheet S3 is disposed on the rear circuit board 3, and passes through the support structure 2 to electrically contact the erasing pressure level contact L3.

In certain embodiments, as shown in FIG. 2, FIG. 6, FIG. 7, FIG. 8 and FIG. 9, the stylus P provided by the present disclosure further includes a front circuit board 8, a shielding collar 9, a magnetic element M, and a fourth conductive member 44. Further, the front circuit board 8 is disposed in the front case 11, and the rear circuit board 3 is disposed in the rear case 12. The shielding collar 9 is sleeved on the support structure 2. The magnetic element M is disposed on the support structure 2 and is covered by the rear case 12. The fourth conductive member 44 passes through the support structure 2 and is electrically connected between the rear circuit board 3 and the shielding collar 9. It should be noted that, since the magnetic element M is disposed on the support structure 2 and is covered by the rear case 12, the stylus P of the present disclosure can be magnetically attached to a portable electronic device having a frame containing magnetic material.

Figure 11:
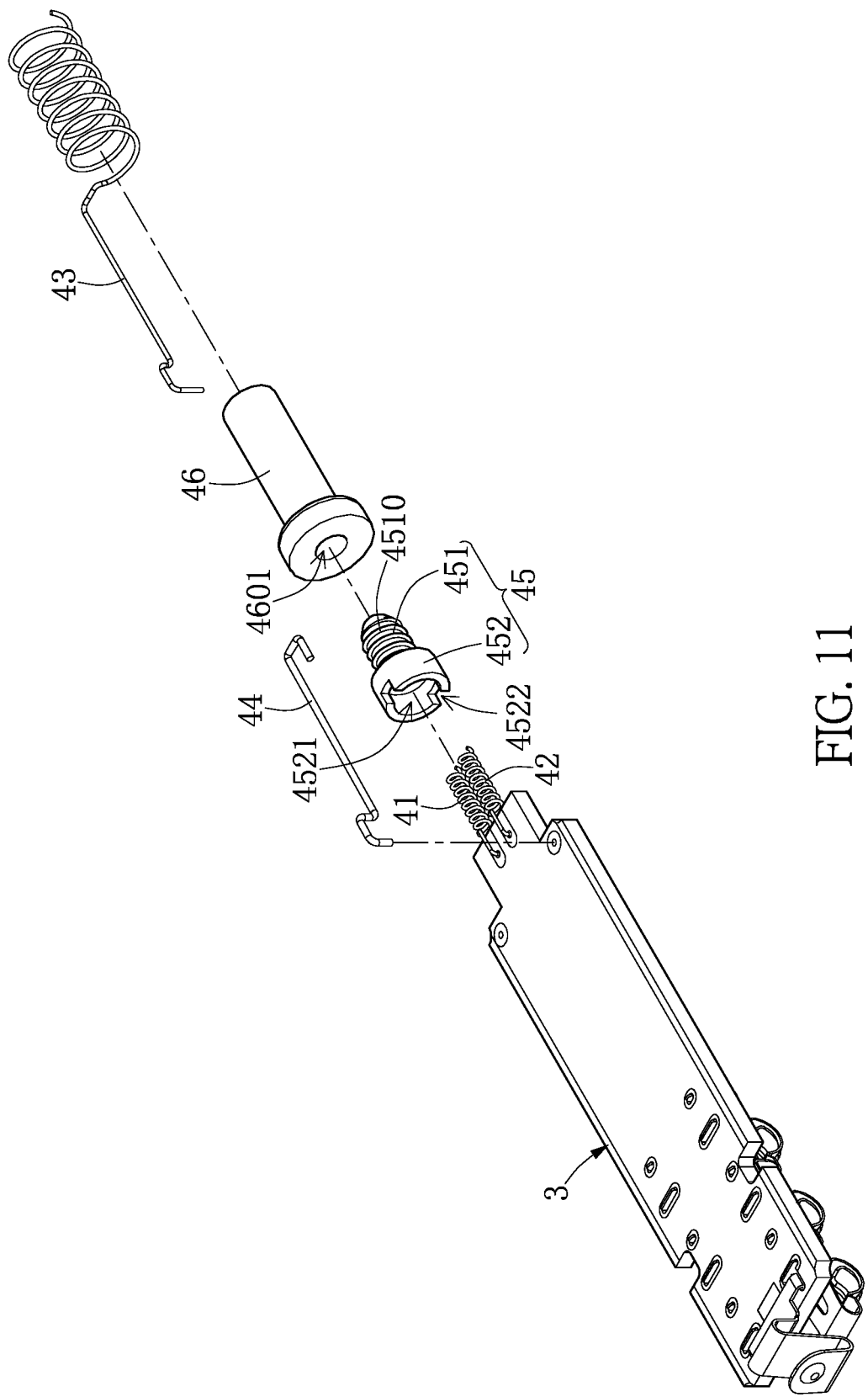
FIG. 11 is a seventh schematic exploded view of a stylus according to an embodiment of the present disclosure.
Figure 12:
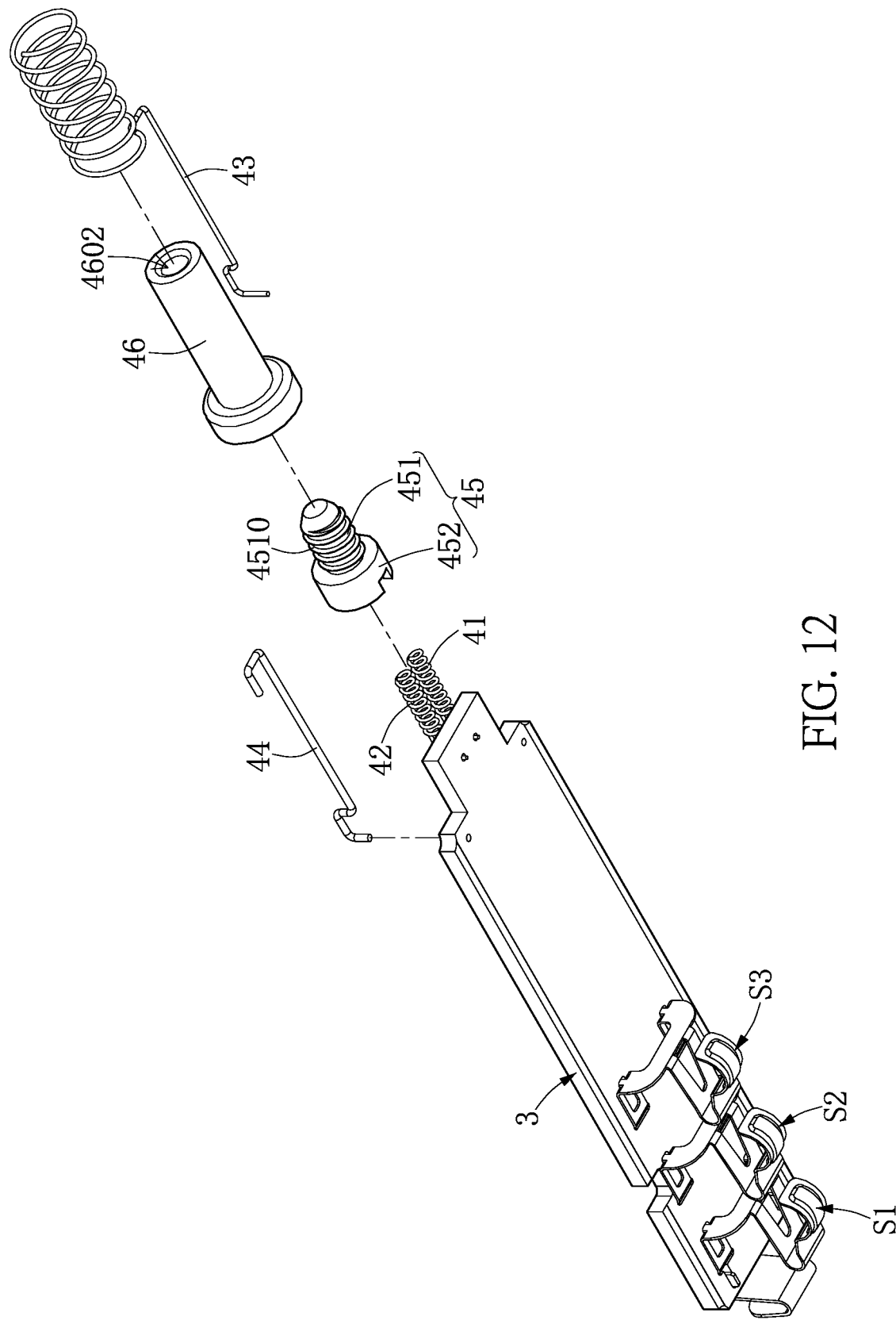
FIG. 12 is an eighth schematic exploded view of a stylus according to an embodiment of the present disclosure.
Figure 13:
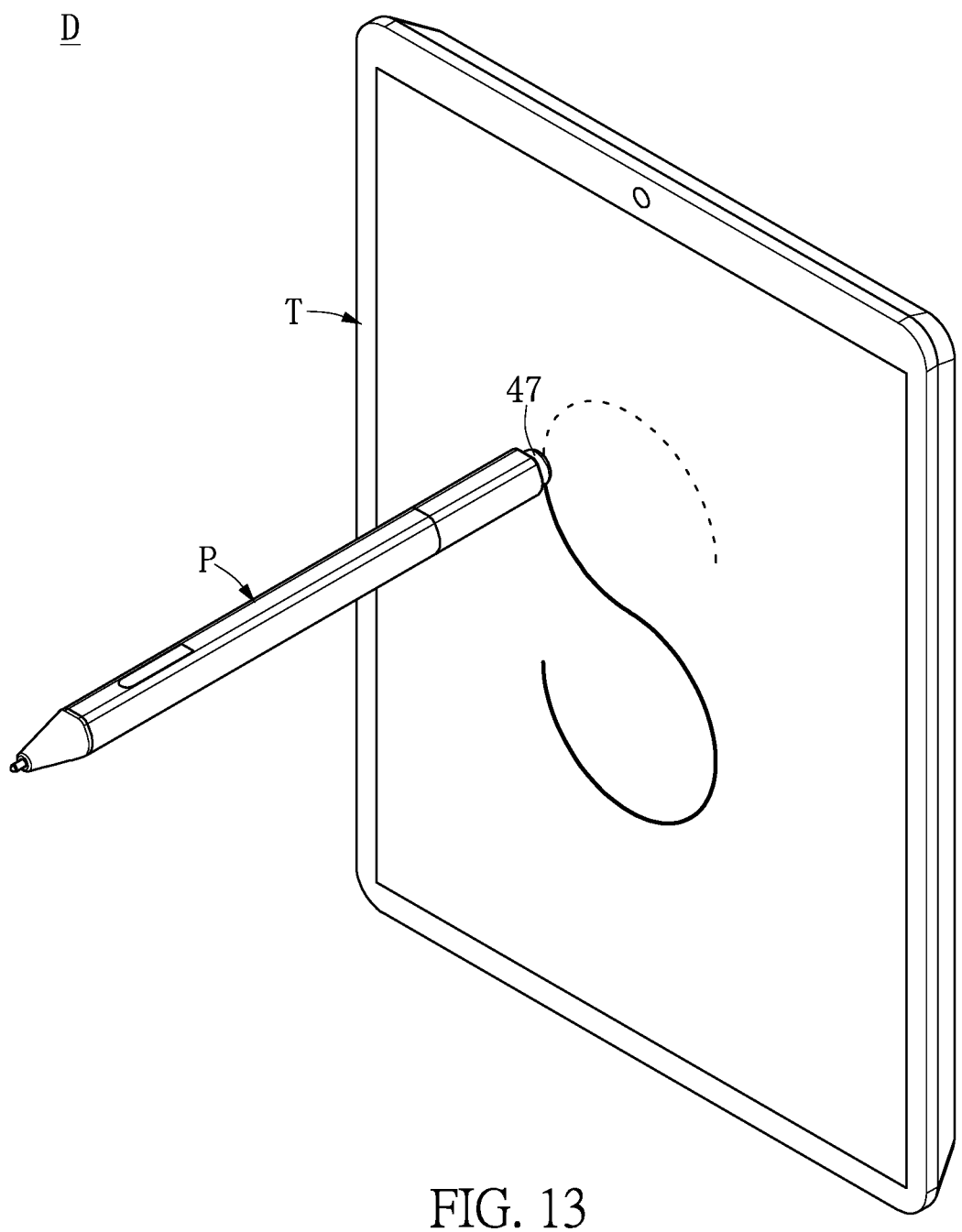
FIG. 13 is a schematic perspective view of a portable electronic device according to an embodiment of the present disclosure.

In certain embodiments, as shown in FIG. 3, FIG. 6 and FIG. 11, the second movable member 46 has a first accommodating portion 4601 and a second accommodating portion 4602. The first movable member 45 has a positioning portion 451 for being positioned in the first accommodating portion 4601, and a contact portion 452 connected to the positioning portion 451 and for separably contacting the first conductive member 41 and the second conductive member 42. The button body 47 has an insertion portion 471 for inserting into the second accommodating portion 4602, and a button portion 472 connected to the insertion portion 471 and for surrounding the third conductive member 43. Further, the outer surface of the positioning portion 451 of the first movable member 45 has a threaded structure 4510. The contact portion 452 of the first movable member 45 has an accommodating slot 4521 for accommodating a part of the first conductive member 41 and a part of the second conductive member 42, and two slots 4522 are arranged correspondingly to each other and communicating with the accommodating slot 4521. The button portion 472 of the button body 47 has an annular groove 4721 for accommodating a portion of the third conductive member 43.

It should be noted that, as shown in FIG. 2, FIG. 3, FIG. 11 and FIG. 13, the present disclosure further provides a portable electronic device D including a touch panel T and a stylus P, and the stylus P can touch the touch panel T to control (for example, signal control) or operate (for example, software operation) the touch panel T. For example, according to different usage requirements, the first conductive member 41 may be an erasing signal ground spring, the second conductive member 42 can be an erasing pressure level spring, the third conductive member 43 can be an erasing signal sensing spring, and the fourth conductive member 44 can be an erasing signal ground line. In addition, the first movable member 45 can be an erasing action trigger, the second movable member 46 can be an erasing action connecting shaft, and the button body 47 can be an erasing button for touching the touch panel T, and the shielding collar 9 can be an erasing signal shielding cover.

In this way, when the stylus P touches the touch panel T with the button body 47, the button body 47 is pressed to drive the first movable member 45 and the second movable member 46 to move simultaneously, so that the first movable member 45 will electrically contact the first conductive member 41 and the second conductive member 42 simultaneously, thereby triggering the stylus P to perform an erasing action targeting the data displayed on the touch panel T. That is, when the first conductive member 41 and the second conductive member 42 are electrically conductive with each other through the first movable member 45, the function assembly 4 of the stylus P outputs an erasing signal to the touch panel T so that the stylus P can utilize the sliding movement of the button body 47 on the touch panel T to correspondingly erase the data presented on the touch panel T (that is, as shown by an imaginary line of FIG. 13, the data displayed on the touch panel T is cleared wherever the button body 47 slides to). However, the present disclosure is not limited thereto.

One of the beneficial effects of the present disclosure is that, through the technical features of "the first movable member 45 can separably contact the first conductive member 41 and the second conductive member 42" and "a part of the third conductive member 43 is sleeved on the second movable member 46, and abutted and contacted by the button body 47," the portable electronic device D and a stylus P thereof, as provided by the present disclosure, enable the second movable member 46 to electrically and simultaneously contact the first and second conductive members 41, 42 when the button body is pressed to drive simultaneous movement of the first and second movable members 45, 46. Thereby, the first conductive member 41 and the second conductive member 42 can be electrically connected with each other through the first movable member 45.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A stylus, comprising:
  a case structure;
  a support structure disposed in the case structure;
  a rear circuit board, disposed in the case structure and positioned on the support structure;
  a function assembly, comprising:
    a first conductive member electrically connected to the rear circuit board;
    a second conductive member electrically connected to the rear circuit board;
    a first movable member configured to separably contact the first and second conductive members;
    a second movable member corresponding to the first movable member;
    a third conductive member, electrically connected to the rear circuit board and partially sleeved on the second movable member; and
    a button body corresponding to the second movable member;
  a head structure, having a portion disposed outside of the case structure and another portion disposed within the case structure;
  a power supply element, disposed in the case structure and electrically connected to the rear circuit board;
  a signal transmission line, electrically connected between a front circuit board and the rear circuit board and having a negative electrode contact, an erasing signal contact and an erasing pressure level contact, wherein the negative electrode contact, the erasing signal contact and the erasing pressure level contact are disposed in a hollow fastening structure;
  a first elastic sheet for conducting a negative electrode, disposed on the rear circuit board and passing through the support structure to electrically contact the negative electrode contact;
  a second elastic sheet for conducting an erasing signal, disposed on the rear circuit board and passing through the support structure to electrically contact the erasing signal contact; and
  a third elastic sheet for conducting an erasing pressure level, disposed on the rear circuit board, and passing through the support structure to electrically contact the erasing pressure level contact;
  wherein when the button body is pressed to drive the first and second movable members to move simultaneously, the first movable member electrically contacts the first and second conductive members simultaneously, so that the first and second conductive members are electrically connected to each other through the first movable member.

2. The stylus according to claim 1, wherein the second movable member has a first accommodating portion and a second accommodating portion;
  wherein the first movable member has
    a positioning portion, positioned in the first accommodating portion and having a threaded structure on an outer surface of the positioning portion; and
    a contact portion, connected to the positioning portion, configured to separably contact the first and second conductive members, and having
      an accommodating slot configured to accommodate a portion of the first conductive member and accommodate a portion of the second conductive member; and
      two slots arranged corresponding to each other and communicating with the accommodating slot; and
  wherein the button body has
    an insertion portion for being inserted into the second accommodating portion; and
    a button portion for surrounding the third conductive member, connected to the insertion portion, and having an annular groove for accommodating a portion of the third conductive member.

3. The stylus according to claim 1, wherein the support structure has
  a first supporting member, having an outer fastening portion formed on an outer surface thereof;
  a second supporting member corresponding to the first supporting member;
  a first accommodating space located between the first supporting member and the second supporting member;
  a second accommodating space located between the first supporting member and the second supporting member; and
  two communicating spaces communicating between the first accommodating space and the second accommodating space; and
  wherein the case structure has a front case having an inner fastening slot formed on an inner surface of the front case, and a rear case corresponding in structure to the front case; and
    wherein the rear circuit board is positioned in the first accommodating space, a contact portion of the first movable member is movably disposed in the second accommodating space, the first conductive member passes through one of the two communicating spaces, the second conductive member passes through the other one of the two communicating spaces.

4. The stylus according to claim 3, further comprising
  a shielding collar sleeved on the support structure;
  a fourth conducting member, passing through the support structure and electrically connected between the rear circuit board and the shielding collar; and
  a magnetic element disposed on the support structure and covered by the rear case;
  wherein the hollow fastening structure is detachably disposed in the front case, and the hollow fastening structure has a fastening portion for being fastened into the inner fastening slot and a fastening slot for being fastened with the outer fastening portion;
  wherein the front circuit board is disposed in the front case, and the rear circuit board is disposed in the rear case.

5. The stylus according to claim 4, wherein the first conducting member is an erasing signal ground spring, the second conducting member is an erasing pressure level spring, the third conducting member is an erasing signal sensing spring, the fourth conducting member is an erasing signal ground line;
  wherein the first movable member is an erasing action trigger, the second movable member is an erasing action connecting shaft, the button body is an erasing button for touching a touch panel, and the shielding collar is an erasing signal shielding cover.

6. A stylus, comprising:
  a case structure;
  a support structure disposed in the case structure;
  a rear circuit board positioned on the support structure;
  a function assembly disposed on the support structure and including
    a first conductive member electrically connected to the rear circuit board;

a second conductive member electrically connected to the rear circuit board;
a first movable member configured to separably contact the first and second conductive members;
a second movable member;
a button body; and
a third conductive member, electrically connected to the rear circuit board, partially sleeved on the second movable member, and being abutted and contacted by the button body;
a head structure, having a portion disposed outside of the case structure;
a power supply element electrically connected to the rear circuit board;
a signal transmission line, electrically connected between a front circuit board and the rear circuit board, and having a negative electrode contact, an erasing signal contact and an erasing pressure level contact, wherein the negative electrode contact, the erasing signal contact and the erasing pressure level contact are disposed in a hollow fastening structure;
a first elastic sheet for conducting a negative electrode, disposed on the rear circuit board and passing through the support structure to electrically contact the negative electrode contact;
a second elastic sheet for conducting an erasing signal, disposed on the rear circuit board and passing through the support structure to electrically contact the erasing signal contact; and
a third elastic sheet for conducting an erasing pressure level, disposed on the rear circuit board and passing through the support structure to electrically contact the erasing pressure level contact.

7. The stylus according to claim 6, wherein the second movable member has a first accommodating portion and a second accommodating portion;
wherein the first movable member has
a positioning portion positioned in the first accommodating portion and having a threaded structure formed on an outer surface of the positioning portion; and
a contact portion, connected to the positioning portion, configured to separably contact the first and second conductive members and having
an accommodating slot for accommodating a portion of the first conductive member and accommodating a portion of the second conductive member; and
two slots arranged corresponding to each other and communicating with the accommodating slot; and
wherein the button body has
an insertion portion for being inserted into the second accommodating portion; and
a button portion for surrounding the third conductive member, connected to the insertion portion, and having an annular groove for accommodating a portion of the third conductive member.

8. The stylus according to claim 6, wherein the case structure has a front case having an inner fastening slot formed on an inner surface of the front case, and a rear case corresponding to the front case;
wherein the support structure has
a first supporting member having an outer fastening portion formed on an outer surface thereof;
a second supporting member corresponding to the first supporting member;
a first accommodating space located between the first supporting member and the second supporting member;
a second accommodating space located between the first supporting member and the second supporting member; and
two communicating spaces communicating between the first accommodating space and the second accommodating space; and
wherein the rear circuit board is positioned in the first accommodating space, the contact portion of the first movable member is movably disposed in the second accommodating space, the first conductive member passes through one of the two communicating space, and the second conductive member passes through the other one of the two communicating spaces.

9. The stylus according to claim 8, further comprising:
a shielding collar sleeved on the support structure;
a fourth conducting member, passing through the support structure and electrically connected between the rear circuit board and the shielding collar; and
a magnetic element disposed on the support structure and covered by the rear case;
wherein the hollow fastening structure is detachably disposed in the front case, and the hollow fastening structure has a fastening portion for being fastened into the inner fastening slot, and a fastening slot for being fastened with the outer fastening portion;
wherein the front circuit board is disposed in the front case, and the rear circuit board is disposed in the rear case.

10. A portable electronic device, comprising:
a touch panel; and
a stylus for touching and controlling the touch panel, including:
a case structure;
a support structure disposed in the case structure;
a rear circuit board positioned on the support structure;
a function assembly disposed on the support structure and including
a first conductive member electrically connected to the rear circuit board;
a second conductive member electrically connected to the rear circuit board;
a first movable member configured to separably contact the first and second conductive members;
a second movable member;
a button body; and
a third conductive member, electrically connected to the rear circuit board, partially sleeved on the second movable member, and being abutted and contacted by the button body;
a head structure, having a portion disposed outside of the case structure;
a power supply element electrically connected to the rear circuit board;
a signal transmission line, electrically connected between a front circuit board and the rear circuit board, and having a negative electrode contact, an erasing signal contact and an erasing pressure level contact, wherein the negative electrode contact, the erasing signal contact and the erasing pressure level contact are disposed in a hollow fastening structure;
a first elastic sheet for conducting a negative electrode, disposed on the rear circuit board and passing through the support structure to electrically contact the negative electrode contact;
a second elastic sheet for conducting an erasing signal, disposed on the rear circuit board and passing through the support structure to electrically contact the erasing signal contact and a third elastic sheet for conducting an erasing pressure level, disposed on the rear circuit board and passing through the support structure to electrically contact the erasing pressure level contact.

\* \* \* \* \*